(12) United States Patent
Cowley et al.

(10) Patent No.: US 7,532,070 B2
(45) Date of Patent: May 12, 2009

(54) ANALOG VARIABLE GAIN AMPLIFIER WITH IMPROVED DYNAMIC RANGE CHARACTERISTICS

(75) Inventors: Nick Cowley, Wiltshire (GB); Ruiyan Zhao, Swindon (GB)

(73) Assignee: Intel Corporation, Santa Clara, CA (US)

( * ) Notice: Subject to any disclaimer, the term of this patent is extended or adjusted under 35 U.S.C. 154(b) by 16 days.

(21) Appl. No.: 11/859,802

(22) Filed: Sep. 24, 2007

(65) Prior Publication Data

US 2009/0079500 A1   Mar. 26, 2009

(51) Int. Cl.
*H03F 3/45* (2006.01)
(52) U.S. Cl. .................................. 330/254; 330/283
(58) Field of Classification Search ................ 330/254, 330/283; 327/359
See application file for complete search history.

(56) References Cited

U.S. PATENT DOCUMENTS 6,392,487 B1 * 5/2002 Alexanian .................... 330/254
6,888,406 B2 * 5/2005 Ashby et al. ................. 330/254

* cited by examiner

*Primary Examiner*—Khanh V Nguyen
(74) *Attorney, Agent, or Firm*—Carrie A. Boone, P.C.

(57) ABSTRACT

An automatic gain control (AGC) system and method for implementing a wide dynamic range automatic gain control (AGC) are disclosed. The AGC system features a large gain adjustment suitable for integration in silicon tuners. The AGC structure employs a pair of classical current steering stages, architecturally arranged to share the gain back-off characteristic in a novel "ping-pong" arrangement. The AGC system and method deliver a wide dynamic range at low power dissipation in radio frequency (RF) systems, but may be implemented as well in other applications.

16 Claims, 7 Drawing Sheets

Figure 4

$$R_{Etot} = \cfrac{1}{\cfrac{1}{\overline{R_{E1}}} + \cfrac{1}{\overline{R_{E2}}}} \quad \text{where;} \quad \overline{R_{E1}} = \cfrac{2*R_{E1}}{\left(\tanh\left(\cfrac{V_{cont}}{V_T}\right)+1\right)} \quad \& \quad \overline{R_{E2}} = \cfrac{2*R_{E2}}{\left(\tanh\left(\cfrac{-V_{cont}}{V_T}\right)+1\right)}$$

$$R_{Etot} = \cfrac{1}{\cfrac{\left(\tanh\left(\cfrac{V_{cont}}{V_T}\right)+1\right)}{2*R_{E1}} + \cfrac{\left(\tanh\left(\cfrac{-V_{cont}}{V_T}\right)+1\right)}{2*R_{E2}}}$$

$$R_{Etot} = \cfrac{2*R_{E1}*2*R_{E2}}{2*R_{E2}*\left(\tanh\left(\cfrac{V_{cont}}{V_T}\right)+1\right) + 2*R_{E1}*\left(\tanh\left(\cfrac{-V_{cont}}{V_T}\right)+1\right)}$$

$$R_{Etot} = \cfrac{4*R_{E1}*R_{E2}}{2*R_{E2}*\left(\tanh\left(\cfrac{V_{cont}}{V_T}\right)+1\right) + 2*R_{E1}*\left(\tanh\left(\cfrac{-V_{cont}}{V_T}\right)+1\right)}$$

Substituting $R_{E2} = K * R_{E1}$ and rearranging $$R_{Etot} = \cfrac{2*K*R_{E1}}{(K-1)*\tanh\left(\cfrac{V_{cont}}{V_T}\right) + K + 1}$$

ANALOG VARIABLE GAIN AMPLIFIER WITH IMPROVED DYNAMIC RANGE CHARACTERISTICS

TECHNICAL FIELD

This application relates to automatic gain control and, more particularly, to improving the dynamic range of an automatic gain control device.

BACKGROUND

It is well documented that present bipolar active variable gain amplifiers have undesirable noise factor and inter-modulation characteristics with gain setting. The noise factor may vary by greater than 1 dB/dB with gain variation and inter-modulation intercept point (IP) degrading with back-off. This results in an unacceptable degradation in carrier-to-noise-plus-inter-modulation power ratio, or C/(N+IM), for the first few (up to 6) dBs of gain back-off.

It is desirable from a signal handling perspective in a radio receiver to apply automatic gain control (AGC) as soon as possible. Applying AGC is intended to protect the internal stages from strong signal inter-modulation. Thus, the gain control is addressed at or as near as possible at the front of the radio frequency (RF) chain.

Conversely, it is desirable from an additive noise perspective to delay front-end AGC-controlled gain back-off as long as possible to minimize degradation in noise factor as the input signal increases and, hence required gain back-off also increases. For this reason, a classical AGC stage is frequently disposed behind input low-noise amplifier (LNA) gain protection, so minimizing degradation in overall noise factor.

Assume that an AGC stage is deployed in the front of the receiver. Further, assume that the AGC stage has sufficient gain to substantially protect the input referred additive noise from the internal stage noise. Then, ideally, the AGC stage of the receiver should have a NF characteristic that is substantially less than 1 dB/dB for the first few dBs of back-off, thus, delivering an improving carrier-to-noise power ratio (C/N). If the NF changed at 1 dB/dB with AGC back-off, then the C/N will never improve or, as is the case with prior art AGC implementations, which changes at greater than 1 dB/dB, the C/N would actually degrade.

A typical prior art AGC stage 10, shown in FIG. 1, is a stacked Gilbert cell with current steering. The AGC stage 10 may, for example, be deployed in an integrated circuit. The signal, $V_{in}$, is input to a gm stage 12. The resulting output current, $I_{out}$, which consists of a standing DC current and a signal current, $V_{in}*gm$ arising from $V_{in}$, is steered through an un-degenerated long-tailed pair 14, between the load 16 and $V_{cc}$. The portion of $I_{out}$ steered to the load 16 generates an output voltage, $V_{out}$; the resultant gain, $V_{out}/V_{in}$, is variable depending on the magnitude of the control voltage, $V_{cont}$. The AGC stage 10 displays the aforementioned undesirable NF variation with gain back-off. The AGC stage 10 of FIG. 1 is one of many possible circuit implementations to achieve this effect.

The NF issue can be partially alleviated by deploying an LNA in front of the AGC stage. However, such an arrangement compromises the inter-modulation performance because higher signals are incident at the AGC input. This can be partially alleviated by applying more current to the AGC stage. Neither of these options are optimum from performance, power, or silicon implementation perspectives.

Thus, there is a need for an AGC design that overcomes the shortcomings of the prior art.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

FIG. 4 is a set of mathematical equations describing the degeneration resistance of the AGC system of FIG. 2, according to some embodiments;

DETAILED DESCRIPTION

In accordance with the embodiments described herein, a system and method for implementing a wide dynamic range automatic gain control (AGC) are disclosed. The AGC system features a large gain adjustment suitable for integration in silicon tuners. The AGC structure employs a pair of classical current steering stages, architecturally arranged to share the gain back-off characteristic in a novel "ping-pong" arrangement. The AGC system and method deliver a wide dynamic range at low power dissipation in radio frequency (RF) systems, but may be implemented as well in other applications. The AGC system is applied to a bipolar process, in some embodiments, but may be suitable for other process technologies as well.

Figure 1:
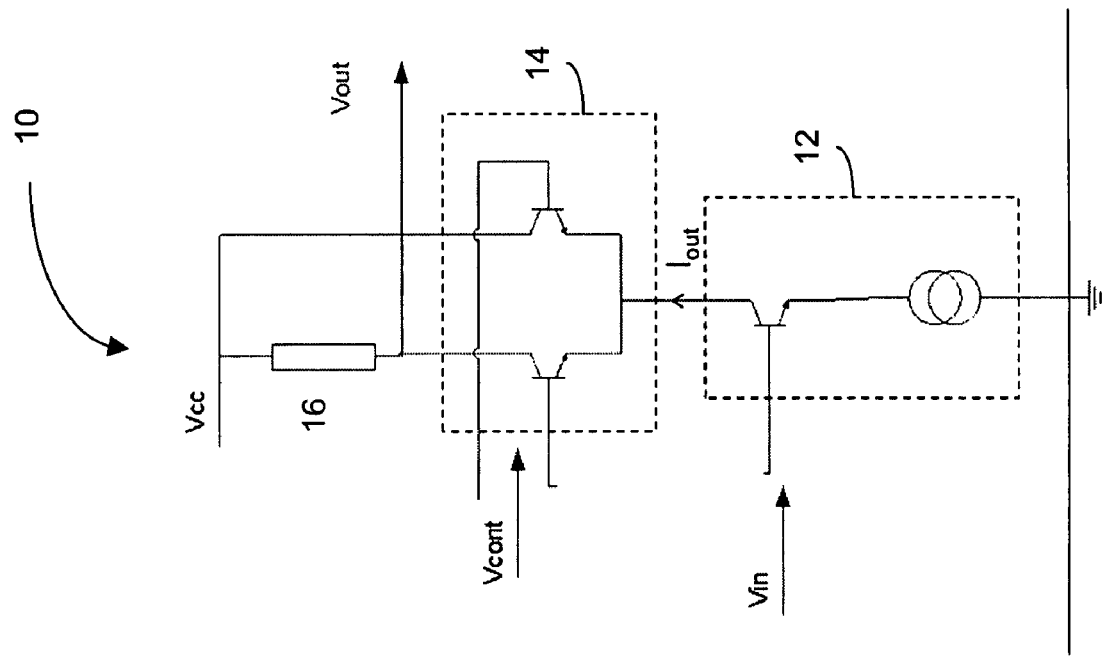
FIG. 1 is a circuit diagram of a stacked Gilbert cell with current steering, according to the prior art.
Figure 2:
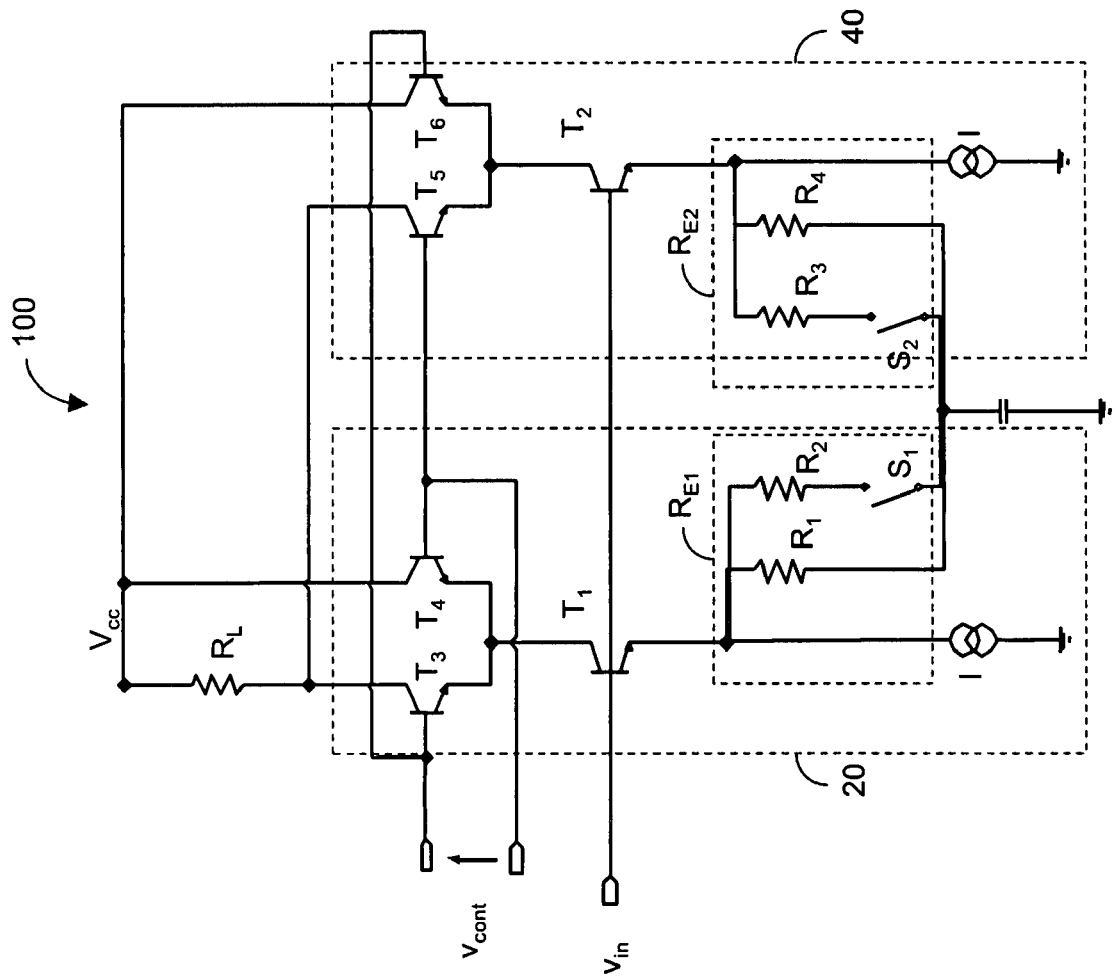
FIG. 2 is a schematic circuit diagram of an AGC system, according to some embodiments.

An AGC system 100 is depicted in FIG. 2, according to some embodiments. The AGC system 100 includes a first stage 20 and a second stage 40. The first stage 20 is a first transconductance stage, consisting of a transistor, $T_1$, with an associated output current steering arrangement, consisting of a steering pair of transistors, $T_3$ and $T_4$, a current source and degeneration resistor, $R_{E1}$, and a switch, $S_1$. As will be shown, when the switch, $S_1$, is closed, the degeneration resistor, $R_{E1}$, having a first degeneration resistance, is formed by the parallel combination of resistors, $R_1$ and $R_2$; when the switch, $S_1$, is opened, the degeneration resistor, $R_{E1}$, is the resistor, $R_1$, only. The second stage 40 is a second transconductance stage, consisting of a transistor, $T_2$, with an associated output current steering arrangement, consisting of a steering pair of transistors, $T_5$ and $T_6$, a current source and degeneration resistor, $R_{E2}$, and a switch, $S_2$. When the switch, $S_2$, is closed, the degeneration resistor, $R_{E2}$, having a second degeneration resistance, is formed by the parallel combination of resistors, $R_3$ and $R_4$; when the switch, $S_2$, is opened, the degeneration resistor, $R_{E2}$, is the resistor, $R_4$, only.

The AGC stages 20 and 40 run at the same tail current and share a common input, $V_{in}$, and a common output load, $R_L$. In some embodiments, the degeneration resistor, $R_1$, for the first stage 20, and the degeneration resistor, $R_3$, for the second stage 40, are set such that a 6 dB higher gain is obtained in the first stage than in the second stage.

Assuming that the noise factor, NF, of the AGC system 100 is dominated by the degeneration resistance (an extremely pessimistic assumption), then all other effects being equal if the NF will scale at 0.5 dB/dB and IP3 at 1 dB/dB with change in the degeneration resistance. (IP3 is short for "third order distortion intercept point", which is a measure of the linearity of an active stage. IP3 is a theoretical value where the level of third-order non-linearity generated intermodulation is of the same value as the fundamental signal, i.e., where the distortion level intercepts with the fundamental signal.) In practice, the degeneration resistance will not be the dominant noise source, so the NF will increase by less than 0.5 dB/dB. (Some simplifying assumptions have been made here, to streamline the description of the concept and benefits. For example, the effect of re is not fully discussed herein.)

Figure 3:
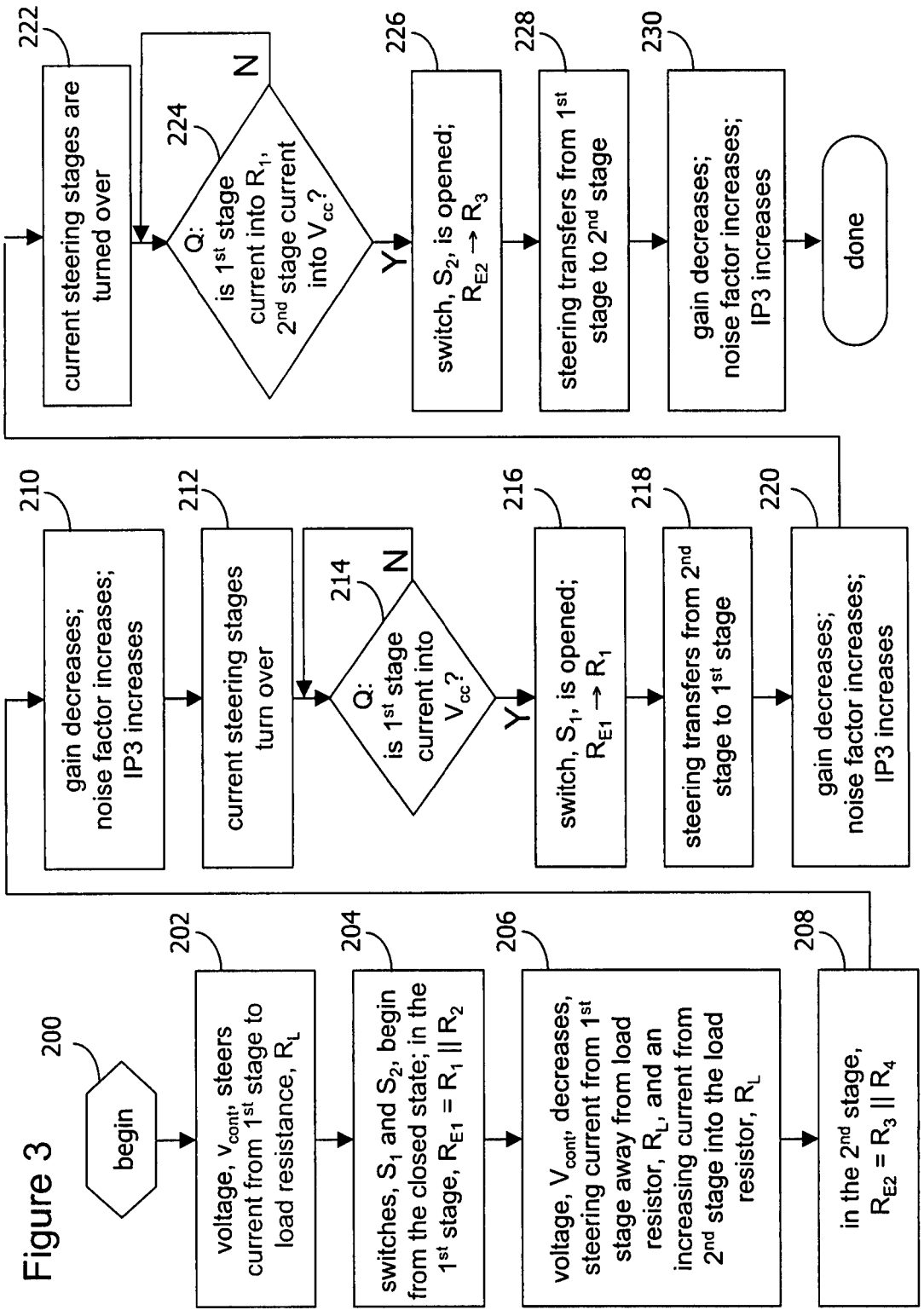
FIG. 3 is a flow diagram of a method for implementing the AGC system of FIG. 2, according to some embodiments.

The operation of the AGC system 100 is described in a flow diagram 200, according to some embodiments, depicted in FIG. 3. Although the operations of the AGC system 100 are presented in a particular order in the flow diagram 200, engineers of ordinary skill in the art will recognize that some of these operations may take place in a different order.

During operation of the AGC system 100, the voltage, $V_{cont}$, initially steers all current from the first stage 20 into the load resistance, $R_L$ (block 202). The switches, $S_1$ and $S_2$, begin in the closed state; hence, in the first stage 20, $R_{E1}$ is formed from the parallel combination of $R_1$ and $R_2$ (block 204). This value is set to give the desired gain, noise factor, and IP3, in combination with the load resistance, $R_L$, and the current, I. The voltage, $V_{cont}$, then decreases, steering an increasing current from the first stage 20 away from the load resistor, $R_L$, and an increasing current from the second stage 40 into the load resistor, $R_L$ (block 206).

Within the second stage 40, since the switch, $S_2$, is also closed, the degenerative resistance, $R_{E2}$, is formed from the parallel combination of resistors, $R_3$ and $R_4$ (block 208). In some embodiments, $R_{E2}$ is arranged so as to satisfy the following equation: $R_{E2}=2*R_{E1}$. This will give a nominal gain difference between the first stage 20 and the second stage 40 of 6 dB, a NF increase of less than 3 dB, and an IP3 increase of 6 dB (block 210).

The current steering stages turn over (block 212). When the current steering stages are completely turned over so that the first stage 20 current is now all into $V_{cc}$ (block 214), the switch, $S_1$, is opened (block 216). In some embodiments, the switches, $S_1$ and $S_2$, are implemented using field effect transistors (FETs). The switch, $S_1$, may be hard switched or analogically switched from the closed position to the opened position. Hard-switching the FET assures that there is a minimum distortion added to the signal path through FET non-linearities.

Following the opening of the switch, $S_1$, the degenerative resistance, $R_{E1}$, increases to $R_1$ (block 216). In some embodiments, the resistor, $R_1$, is fabricated from a parallel switched arrangement. The resistor, $R_1$, is arranged so as to satisfy the following equation: $R_1=2*R_{E2}=4*R_{E1}$.

Next, the steering arrangement transfers back from the second stage 40 to the first stage 20 (block 218). Accordingly, the gain decreases by a further 6 dB, the NF increases by less than 3 dB, and the IP3 increases by 6 dB, giving a total of 12 dB gain reduction, a 6 dB NF increase, and a 12 dB IP3 increase (block 220).

Again, the current steering stages are completely turned over (block 222) so that the first stage 20 current is now all into $R_1$ and the second stage 40 is into $V_{cc}$ (block 224). The switch, $S_2$, is opened, causing the degeneration resistance, $R_{E2}$, to increase to $R_3$ (block 226). As with the resistor, $R_1$, the resistor, $R_3$, is fabricated from a parallel switched arrangement, in some embodiments. The resistor, $R_3$, is arranged so as to satisfy the following equation: $R_3=2*R_1=4*R_{E2}=8*R_{E1}$.

Again, the steering arrangement transfers back from the first stage 20 to the second stage 40 (block 228). In some embodiments, the steering voltage for the second stage 40 is simply the inverse of the steering voltage for the first stage 20. The gain now decreases by a further 6 dB, the NF increases by less than 3 dB, and the IP3 increases by 6 dB, giving a total of a 18 dB gain reduction, a 9 dB NF increase, and a 18 dB IP3 increase (block 230).

The AGC system 100 may include further transfers between the first stage 20 and the second stage 40, to provide further gain reduction. Circuit designers of ordinary skill in the art will recognize extensions that may be made to the degeneration resistance, $R_{E1}$, to incorporate additional switching values. The additional stages may increment at the same rate (6 dB) as shown above. Or, the increments may be larger, depending on whether the required maximum IP3 has been achieved. While the degeneration resistances, $R_{E1}$ and $R_{E2}$ are formed using parallel resistors, $R_1$ and $R_2$, and $R_3$ and $R_4$, respectively, a series arrangement of resistors may instead be used to form the degeneration resistances, or a combination of parallel and series degeneration resistances may be used.

The AGC system 100 is depicted as a single-ended arrangement. However, the AGC system may be implemented as a differential circuit, such as in applications where a second order intercept is needed.

The composite gain for the AGC system 100, for a given control voltage and degeneration, can be calculated from the load resistance, $R_L$, and the effective degeneration resistance formed by the parallel combination of the two degeneration resistances, $R_{E1}$ and $R_{E2}$, multiplied by the hyperbolic tangent (TANH) characteristic of the steering pairs.

FIG. 4 is a set of mathematical equations, which illustrate the effective degeneration resistance, $R_{Etot}$, of the AGC system 100, where $R_{E2}=2*R_{E1}=20$ ohm.

Figure 5:
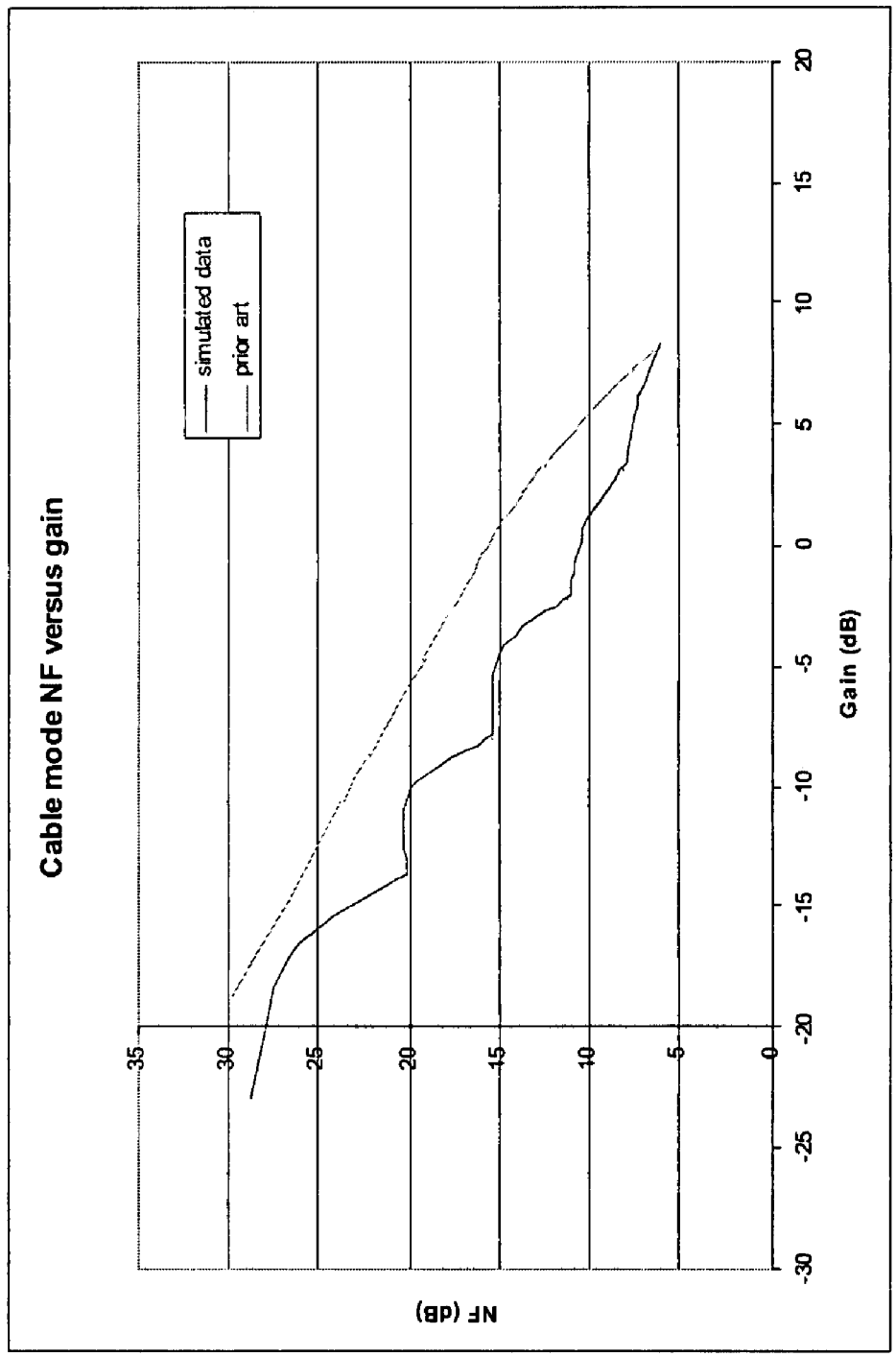
FIG. 5 is a graph showing noise factor versus gain for an implementation of the AGC system of FIG. 2, according to some embodiments.
Figure 6:
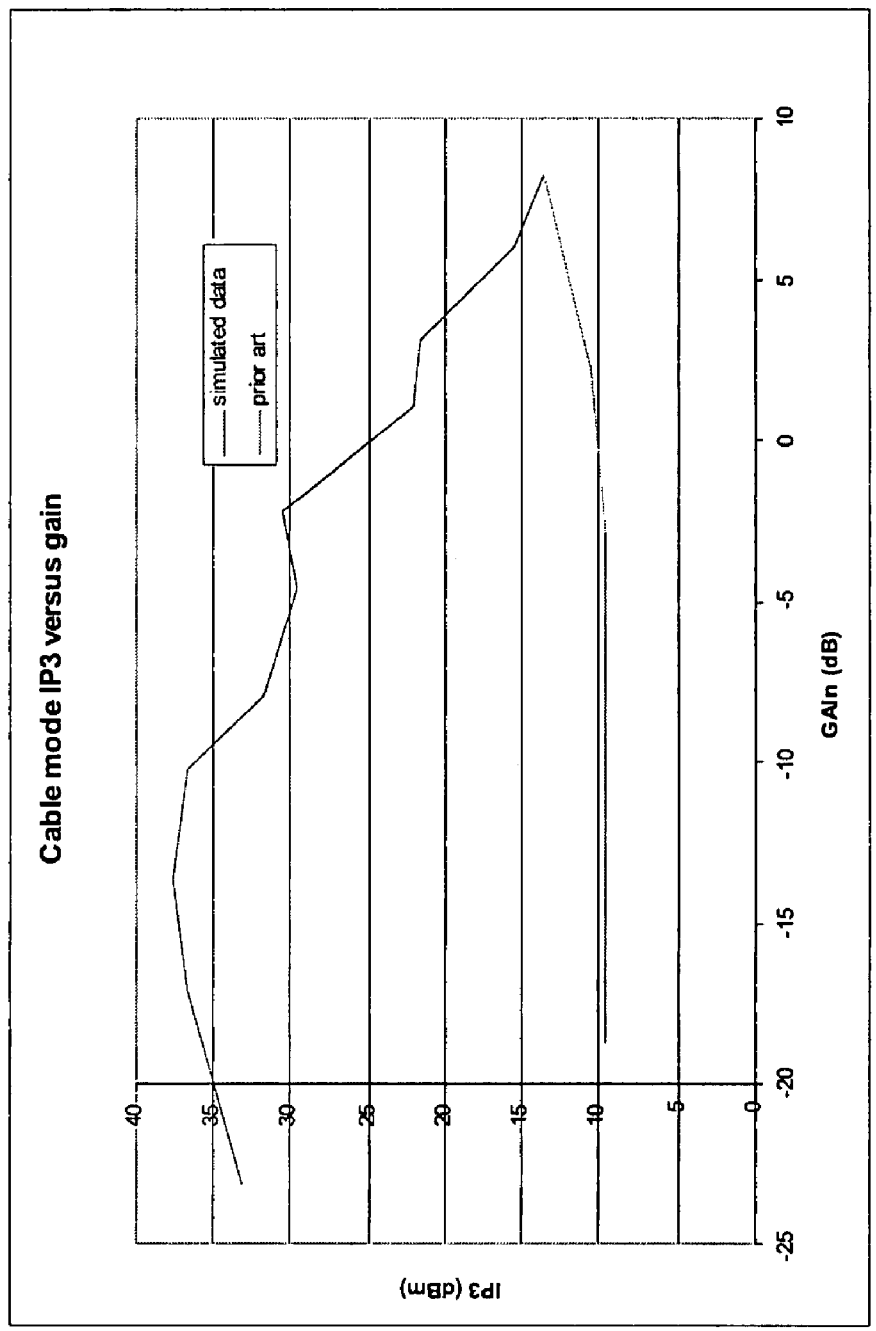
FIG. 6 is a graph showing IP3 versus gain for an implementation of the AGC system of FIG. 2, according to some embodiments.
Figure 7:
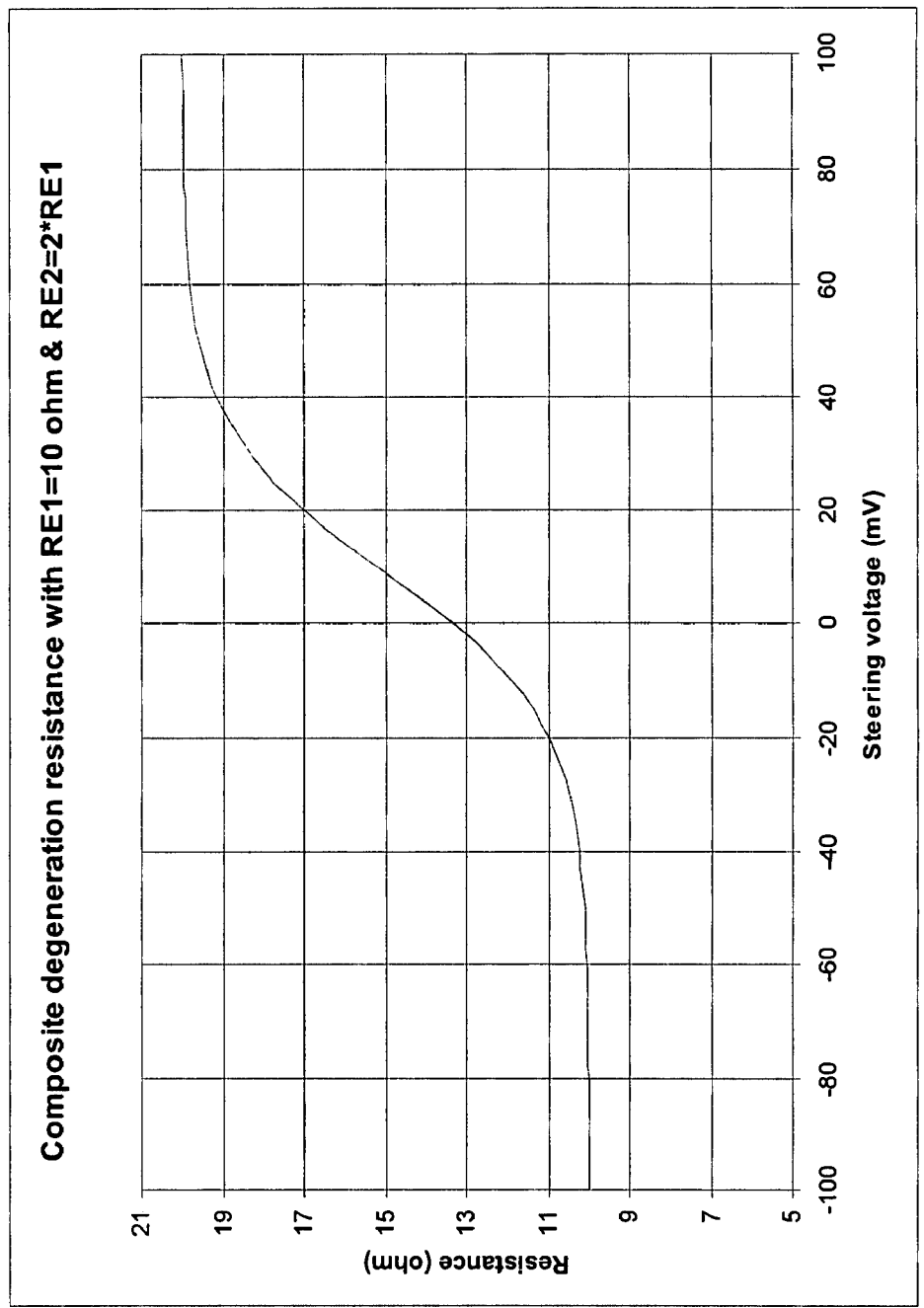
FIG. 7 is a graph showing a calculated composite degeneration resistance using the AGC system of FIG. 2, according to some embodiments.

The AGC system 100, using the method 200, substantially overcomes the undesirable AGC characteristic. Further, the AGC system 100 and method 200 enable a gain-controlled amplifier to be implemented with a greatly improved noise and inter-modulation characteristic than any known architecture consuming a similar or lower power. The NF shows a characteristic that is typically less than half the degradation with gain back-off, compared to a conventional current steering stage, coupled with an inter-modulation intercept that increases rather than degrades with gain back-off, as happens with a conventional stage. The greatly improved characteristic for NF and inter-modulation intercept simulated with a practical implementation are shown in the graphs 50 and 60, of FIGS. 5 and 6, respectively. The graph 50 (FIG. 5) shows noise factor versus gain while the graph 60 (FIG. 6) shows IP3 versus gain. FIG. 7 is a graph 70 showing a calculated composite degenerate resistance using the AGC system of FIG. 2, according to some embodiments.

Using the AGC system 100 and method 200, it is thus possible to exploit the improving IP3 characteristic, which is typically desired at gain back-off, to implement a low-noise amplifier that has a lower IP3 at maximum gain than required at gain reduction, which will be accompanied by a lower NF, lower power, or more probably a combination of both, thus offering an improved sensitivity over prior art implementations.

Additionally, since the NF characteristic shows much less than a 1 dB/dB characteristic for the first few dBs of back-off, the AGC system 100 can be deployed at the input to an RF chain, yet still provide an improving C/N with gain back-off. Such an implementation is not achievable in the prior art, unless preceded by a low-noise amplifier, which will degrade IP3 and power. Thus, the AGC system 100 allows superior performance than previously disclosed architectures, offering improved system C/N performance.

The curves in the graphs 50 and 60 (FIGS. 5 and 6) are for an arrangement with the degeneration resistance implemented differentially, as shown in Table 1, according to some embodiments.

TABLE 1

Degeneration resistances for AGC system 100

| transfer number | transfer direction | $R_{E1}$ 1$^{st}$ stage (Ω) | $R_{E2}$ 2$^{nd}$ stage (Ω) |
|---|---|---|---|
| 1 | 1$^{st}$ to 2$^{nd}$ stage | 25 | 50 |
| 2 | 2$^{nd}$ to 1$^{st}$ stage | 100 | 50 |
| 3 | 1$^{st}$ to 2$^{nd}$ stage | 100 | 200 |
| 4 | 2$^{nd}$ to 1$^{st}$ stage | 400 | 200 |
| 5 | 1$^{st}$ to 2$^{nd}$ stage | 400 | 1200 |

In some embodiments, the AGC system 100 maintains a fixed direct current (DC) value on the load resistance, $R_L$, which then maintains a constant DC value into the input of following stages. This, in turn, causes a constant collector base bias in the following stage to be maintained, which considerably eases cell design, in some embodiments. Prior art AGC stages show a gain-dependent DC level on the load, which can be problematic. In addition, the suppression of the change in the DC value with gain setting will prevent the introduction of DC dependent amplitude modulation, as occurs in a conventional stage.

The AGC system 100 thus expands the dynamic range of conventional current steering stages by applying cross-coupled steering pairs in combination with switching of degeneration feedback resistors.

In addition to achieving the gain reductions described above, the AGC system 100 may increase gain, in some embodiments, by applying the previously described changes of switches and steering currents in an inverse sequence. Circuit designers of ordinary skill in the art recognize that such an inverse sequence will increase, rather than decrease, the gain of the AGC system 100.

While the application has been described with respect to a limited number of embodiments, those skilled in the art will appreciate numerous modifications and variations therefrom. It is intended that the appended claims cover all such modifications and variations as fall within the true spirit and scope of the above description.

We claim:

1. An automatic gain control system, comprising:
   a first stage, comprising:
      a first transconductance stage with an associated output current steering arrangement;
      a first degeneration resistor having a first degeneration resistance; and
      a first switch arrangement, wherein the first degeneration resistance is determined by the first switch arrangement; and
   a second stage, comprising:
      a second transconductance stage with an associated output current steering arrangement;
      a second degeneration resistor having a second degeneration resistance; and
      a second switch arrangement, wherein the second degeneration resistance is determined by the second switch arrangement; and
   a load resistor;
   wherein an input voltage steers between an output current of the first stage and an output current of the second stage, with an associated change in gain each time the output current steers between stages.

2. The automatic gain control system of claim 1, the first degeneration resistor further comprising:
   a first resistor comprising a first resistance and a second resistor comprising a second resistance;
   wherein the first resistance equals the first degeneration resistance when the first switch arrangement is in a first state.

3. The automatic gain control system of claim 2, wherein the first resistor and the second resistor are arranged in parallel.

4. The automatic gain control system of claim 2, wherein the first resistor and the second resistor are arranged in series.

5. The automatic gain control system of claim 1, wherein the second degeneration resistance is equal to twice the first degeneration resistance.

6. The automatic gain control system of claim 2, wherein the first resistance is equal to twice the second degeneration resistance.

7. The automatic gain control system of claim 1, wherein the gain changes three times, a noise factor changes three times, and a third-order distortion intercept point change three times, wherein the noise factor and third-order distortion point change as an inverse of the gain change.

8. The automatic gain control system of claim 1, the first stage comprising a first control voltage, the second stage comprising a second control voltage, wherein the first control voltage is equal and opposite to the second control voltage.

9. The automatic gain control system of claim 1, further comprising a system output current, wherein the system output current is equal to a sum of the output current of the first stage and the output current of the second stage and a ratio between the first stage output current and the second stage output current is determined by a magnitude of the input voltage.

10. An automatic gain control method, comprising:
   closing a first switch such that a degeneration resistor in a first stage of a circuit has a first resistance;
   closing a second switch such that a second degeneration resistor in a second stage of the circuit has a second resistance;
   steering a current by an input voltage from the first stage to a load resistance of a circuit; and
   steering between an output current from the first stage to an output current of a second stage as a control voltage decreases;
   wherein gain of the circuit changes, a noise factor of the circuit changes, and a third-order distortion intercept point of the circuit changes, wherein the noise factor and third-order distortion intercept point change as an inverse of the gain change.

11. The automatic gain control method of claim 10, further comprising:
   opening the first switch such that the degeneration resistor approaches a third resistance; and
   steering between the output current from the second stage to the output current of the first stage;

wherein the change in gain of the circuit increases, the change in noise factor of the circuit increases, and the change in third-order distortion intercept point of the circuit increases.

12. The automatic gain control method of claim 11, further comprising:
opening the second switch such that the second degeneration resistor approaches a fourth resistance.

13. The automatic gain control method of claim 12, further comprising:
steering between the output current from the second stage to the output current from the first stage;
wherein the change in gain of the circuit increases a third time, the change in noise factor of the circuit increases a third time, and the change in third-order distortion intercept point of the circuit increases a third time.

14. The automatic gain control method of claim 10, further comprising:
successively reducing transconductance of the circuit.

15. The automatic gain control method of claim 10, closing a first switch further comprising:
closing the first switch after the output current from the first stage has been completely steered away from an output load.

16. The automatic gain control method of claim 10, closing a second switch further comprising:
closing the second switch after the output current from the second stage has been completely steered away from an output load.

* * * * *